(12) United States Patent
Das et al.

(10) Patent No.: US 10,330,767 B2
(45) Date of Patent: Jun. 25, 2019

(54) CALIBRATED MEASUREMENT SYSTEM AND METHOD

(71) Applicant: Texas Instruments Incorporated, Dallas, TX (US)

(72) Inventors: Abhijit Kumar Das, Plano, TX (US); Christy Lee She, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 309 days.

(21) Appl. No.: 14/951,902

(22) Filed: Nov. 25, 2015

(65) Prior Publication Data

US 2017/0146633 A1  May 25, 2017

(51) Int. Cl.
| | |
|---|---|
| *G01R 35/00* | (2006.01) |
| *G01R 31/02* | (2006.01) |
| *G01K 19/00* | (2006.01) |
| *G01K 15/00* | (2006.01) |
| *G01K 7/16* | (2006.01) |

(52) U.S. Cl.
CPC .................................. *G01R 35/005* (2013.01)

(58) Field of Classification Search
CPC ...... G01R 35/00; G01R 35/005; G01R 31/02; G01K 19/00; G01K 15/00; G01K 15/005; G01K 7/16
See application file for complete search history.

(56) References Cited

U.S. PATENT DOCUMENTS

| | | | | |
|---|---|---|---|---|
| 2009/0115522 A1* | 5/2009 | Lyden | ..................... | H03F 3/387 330/258 |
| 2013/0293241 A1* | 11/2013 | Mayer | ................... | G01R 31/025 324/510 |

* cited by examiner

*Primary Examiner* — Neel D Shah
(74) *Attorney, Agent, or Firm* — Kenneth Liu; Charles A. Brill; Frank D. Cimino

(57) ABSTRACT

A calibrated measurement circuit, with a first node, a second node, a circuit element coupled between the first node and the second node, and a reference circuit element. The calibrated measurement circuit also comprises circuitry for directing a first current and a second current between the first node and the second node and to the reference circuit element. The calibrated measurement circuit also comprises circuitry for measuring voltage across the circuit element in response to the first and second currents, and circuitry for measuring voltage across the reference circuit element in response to the first and second currents. A calibration factor is also determined for calibrating measured voltages across the circuit element, in response to a relationship between the first voltage, the second voltage, and the reference circuit element.

15 Claims, 6 Drawing Sheets

US 10,330,767 B2

CALIBRATED MEASUREMENT SYSTEM AND METHOD

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to electronic circuits and more particularly circuits wherein a calibrated measure is performed.

In certain electronic circuits, a measure of voltage is a response to some factor being sensed or determined in connection with the circuit. Such a measure sometimes occurs in various sensors, and one common example used in this document is a resistance temperature detector (RTD). An RTD sensor/circuit includes a temperature-dependent resistor, whereby a voltage across a temperature-dependent resistor is measured and corresponds to its resistance, so that resistance further corresponds to the then-existing temperature to which the resistor is exposed. The RTD may be used in numerous applications and often provide a reasonably accurate, repeatable, and stable measure of temperature.

While RTD sensors have proven useful and successful in various prior art systems, various factors may affect the accuracy of the sensor. By way of background to certain of those factors, FIG. 1 illustrates a prior art RTD system 10 implemented in connection with a prior art analog-to-digital converter (ADC) 12, commercially available, for example, as the ADS1120 from Texas Instruments Incorporated (although others are also contemplated, such as different sizes, including the ADS1248, a 24-bit device). ADC 12 includes the various pins as indicated in the Figure around the perimeter of a device. ADC 12 also includes a switching multiplexer (MUX) 14 connected between four pins (AIN0, AIN1, AIN2, and AIN3) and two current sources IDAC1 and IDAC2, a programmable array amplifier (PGA) 16, and a low voltage pin AVSS. In the illustration of FIG. 1, and as shown by dashed lines, MUX 14 is switched to connect a current, $I_1$, from source IDAC1 to pin AIN2 (shown therefore by parenthesis (IDAC1) at the pin) and to connect a current, $I_2$, from source IDAC2 to pin AIN3 (shown therefore by parenthesis (IDAC2) at the pin). The outputs of PGA 16 are connected, as inputs to a 16-bit conversion block 18. Block 18 outputs to a filter block 20, which outputs a 16-bit data Code representative of the analog input voltage difference at pins AIN0 and AIN1, relative to a reference voltage difference between its respective positive and negative reference input pins, REFP0 and REFN0. The additional blocks illustrated of ADC 12 should be understood to one skilled in the art, presumed not needing of discussion for the current context, and are further described in the readily-available datasheet for the above-identified commercially available part, and such datasheet is hereby incorporated herein by reference.

RTD system 10 also includes an RTD sensor 22 connected to ADC 12. In the illustrated example, RTD sensor 22 is a 3-lead device, although as known in the art RTD sensors may include a different number of leads (e.g., two or four). RTD sensor 22 includes a temperature-dependent resistance $R_{RTD}$, which is typically constructed of a length of thin coiled wire wrapped around a core, and where the wire material and, hence, the overall device, has a highly predictable correlation between temperature and resistance. Each of the three leads of sensor 22 also has an associated (and typically assumed equal) resistance, where such resistances are shown in FIG. 1 as $R_{LEAD1}$, $R_{LEAD2}$, and $R_{LEAD3}$, where such wires, and their corresponding resistance, may include that included with the sensor as well as additional wire, if any, added to the sensor (e.g., by the end user). Resistance $R_{LEAD1}$ is connected between a first terminal T1 of resistor $R_{TD}$ and a first sensor node $22_{N1}$, while resistance $R_{LEAD2}$ is connected between a second terminal T2 of resistor $R_{RTD}$ and a second sensor node $22_{N2}$, and resistance $R_{LEAD3}$ is connected between the second terminal T2 of resistor $R_{RTD}$ and a third sensor node $22_{N3}$. Node $22_{N1}$ is connected to the AIN2 pin of ADC 12 (to receive the current $I_1$ from IDAC1), and node $22_{N2}$ is connected to the AIN3 pin of ADC 12 (to receive the current $I_2$ from IDAC2). Node $22_{N3}$ is connected to a first terminal of a precision, low-drift reference resistor $R_{REF}$, and the second terminal of reference resistor $R_{REF}$ is connected to ground.

Also connected to ADC 12 in RTD system 10 are filter circuits 24 and 26, where the capacitors therein are generally recommended to attenuate high-frequency noise components and the resistors provide part of the filtering aspect. Beyond this introduction, however, such components are not particularly germane to the present discussion. Additionally, ADC 12 as has positive analog power supply input pin AVDD connected to receive a fixed voltage (e.g., 3.3 V) along with a decoupling capacitor $DC_1$ connected between that input and ground, and similarly ADC 12 as has positive digital power supply input pin DVDD connected to receive a fixed voltage (e.g., 3.3 V) along with a decoupling capacitor $DC_2$ connected between that input and ground.

The operation of RTD system 10 is as follows. Current sources IDAC1 and IDAC2 are enabled to provide an equal amount of current $I_1 = I_2$ (e.g., via programmable bits in the ADC configuration register). The two currents combine and that combined current (i.e., $I_1 + I_2$) flows through reference resistor $R_{REF}$, and the resulting voltage across resistor $R_{REF}$ is available for ADC 12 as the ADC reference voltage, $V_{REF}$, as between pins REFP0 and REFN0. Thus, such measure should evaluate the voltage as shown in the following Equation 1:

$$V_{REF} = (I_1 + I_2) * R_{REF} \qquad \text{Equation 1}$$

where in Equation 1 any of the filter 26 resistors are assumed to be very small in a relative sense and, thus, the voltage drop across them is not limiting to the measurement accuracy. In the prior art, it is assumed that IDAC1 and IDAC2 are sufficiently matched, even across temperature, to provide equal amounts of current, again reiterating the programmed desire that $I_1 = I_2$. Thus, Equation 1 may be re-written as the following Equation 2:

$$V_{REF} = (2I_1) * R_{REF} \qquad \text{Equation 2}$$

To simplify the following discussion, the lead resistance values ($R_{LEADx}$) are assumed to be zero. With this assumption, next the voltage, $V_{RTD}$, is measured across resistor $R_{RTD}$, as detected across input pins AIN0 and AIN1, in response to only the excitation of IDAC1 to provide $I_1$. Thus, such measure should evaluate the voltage as shown in the following Equation 3:

$$V_{RTD}(I_1) * R_{RTD} \qquad \text{Equation 3}$$

Assuming switches $S_1$ and $S_2$ are open, then PGA 16 internally amplifies the measured voltage by a gain, A, and conversion block 18 and filter block 20 thereby produce a corresponding digital (e.g., 16-bit) Code, representing the relationship of $V_{RTD}$ to $V_{REF}$, according to the following Equations 4 through 5:

$$\text{Code} \propto \frac{V_{RTD} * A}{V_{REF}} \quad \text{Equation 4}$$

Substituting $V_{RTD}$ of Equation 3 in the numerator of Equation 4, and $V_{REF}$ of Equation 2 into the denominator of Equation 4, gives the following Equation 5:

$$\text{Code} \propto \frac{(I_1) * R_{RTD} \cdot A}{(2I_1) R_{REF}} = \frac{R_{RTD} \cdot A}{2 R_{REF}} \quad \text{Equation 5}$$

Equation 5 indicates that the output Code depends on the value of resistor $R_{RTD}$, the PGA gain A, and the reference resistor $R_{REF}$, but not on $I_1$, $I_2$ or $V_{REF}$. The absolute accuracy and temperature drift of the excitation current therefore, with the assumptions provided, does not matter as long as $I_1 = I_2$. In any event, from the preceding, and assuming A and $R_{REF}$ and constant, then at any measure of $V_{RTD}$, a resultant Code corresponds to the value of $R_{RTD}$ (times some constant), and that value of $R_{RTD}$ may thus be processed to correspond to a temperature expected to cause such resistance, thereby providing an accurate temperature sensing function.

While the above approach has proven workable for various applications and by way of a discrete device, certain processes may result in higher temperature drifts in which case the assumption of $I_1 = I_2$ does not provide sufficiently reliable results.

Given the preceding, the present inventors have identified improvements and alternatives to the prior art, as are further detailed below.

BRIEF SUMMARY OF THE INVENTION

In a preferred embodiment, there is a calibrated measurement circuit. The calibrated measurement circuit comprises a first node, a second node, and a circuit element coupled between the first node and the second node. The calibrated measurement circuit also comprises: (i) circuitry for directing a first current between the first node and the second node; (ii) circuitry for measuring a first voltage across the circuit element in response to the first current; (iii) circuitry for directing a second current between the first node and the second node; (iv) circuitry for measuring a second voltage across the circuit element in response to the second current; (v) a reference circuit element; (vi) circuitry for directing the first current through the reference circuit element; (vii) circuitry for measuring a first voltage across the reference circuit element in response to the first current; (viii) circuitry for directing the second current through the reference circuit element; (ix) circuitry for measuring a second voltage across the reference circuit element in response to the second current; and circuitry for determining a calibration factor, for calibrating measured voltages across the circuit element, in response to a relationship between the first voltage, the second voltage, and the reference circuit element.

Numerous other inventive aspects and preferred embodiments are also disclosed and claimed.

DETAILED DESCRIPTION OF EMBODIMENTS

Figure 1:
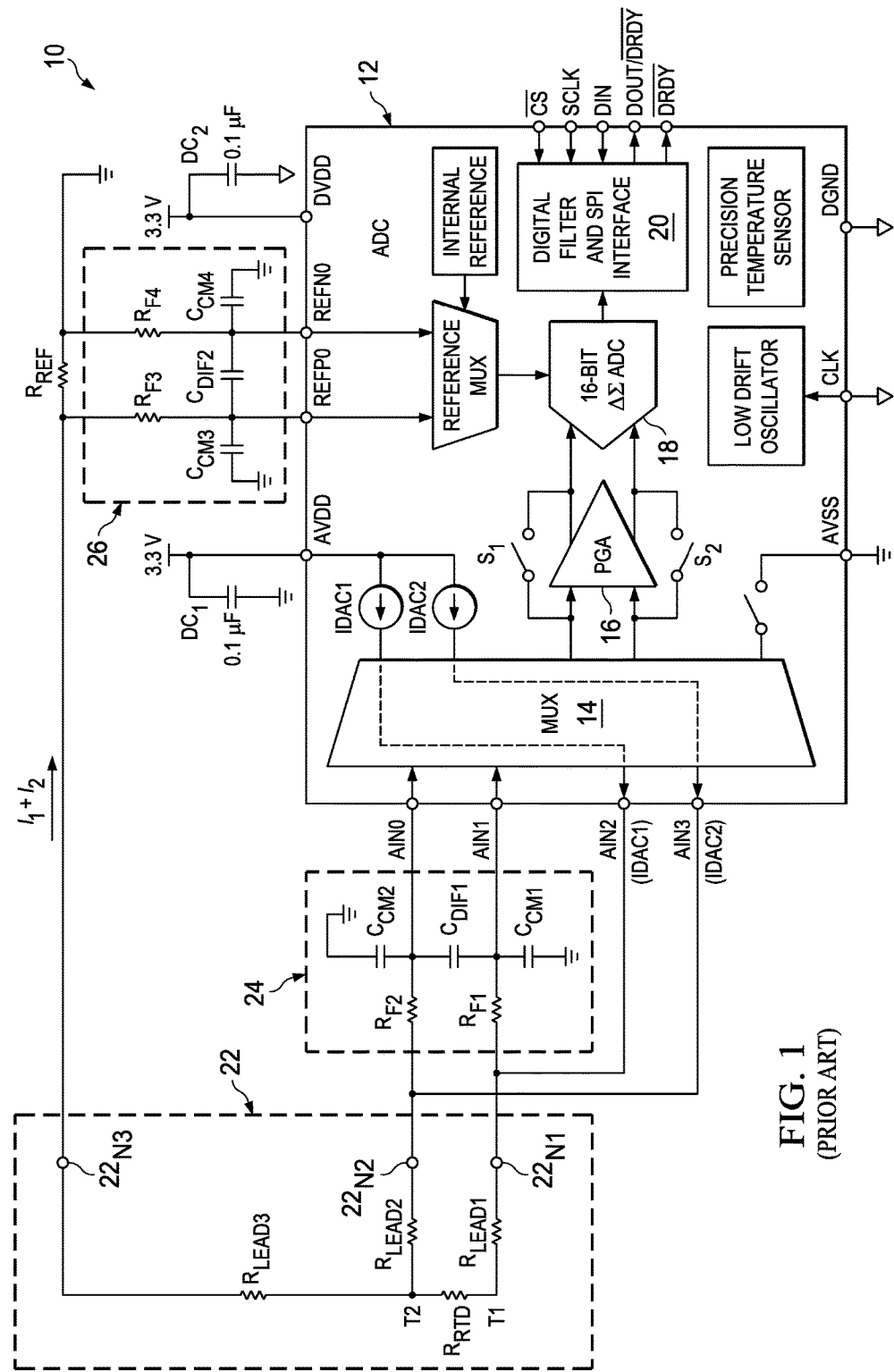
FIG. 1 illustrates a prior art resistance temperature detector (RTD) system.

FIG. 1 was described above in the Background of the Invention section of this document and the reader is assumed familiar with that discussion.

Figure 2A:
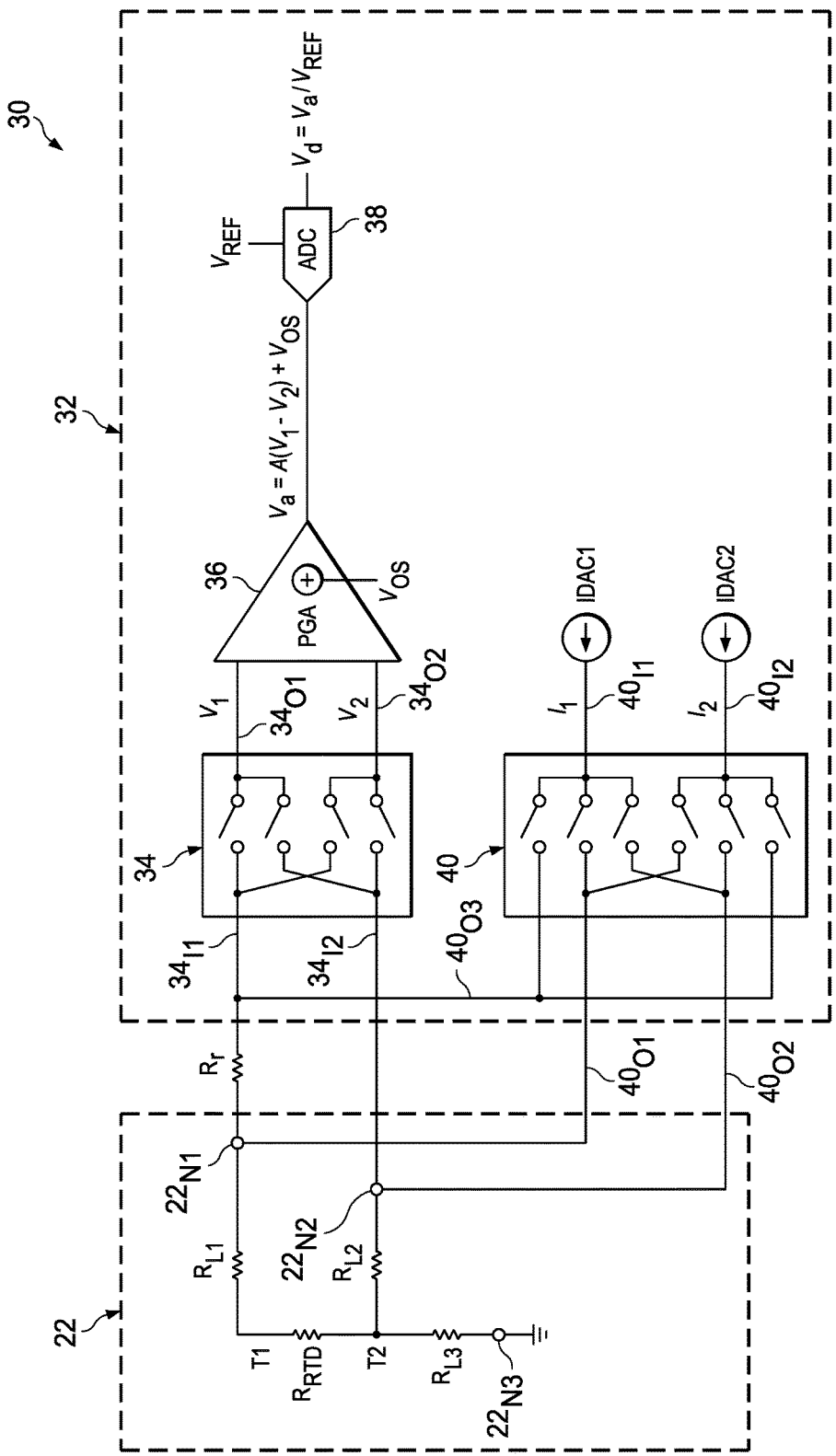
FIG. 2A illustrates a combined electrical block and schematic diagram of a preferred embodiment RTD system.

FIG. 2A illustrates a combined electrical block and schematic diagram of a preferred embodiment temperature detector (RTD) system 30, where each of the blocks may be implemented by one skilled in the art according to known principles and the teachings of this document, such as through various combinations of circuitry and programming (software, firmware, and the like). System 30 is provided by way of example, as a preferred embodiment method of measurement and calibration, and it may be implemented into other circuits, as also addressed later. In a preferred embodiment, system 30 includes an integrated circuit 32, which in certain respects is comparable to the analog-to-digital converter (ADC) 12 described earlier and is also connected to an RTD sensor 22, which again includes a temperature-dependent resistance $R_{RTD}$ and three associated (and typically assumed equal) lead resistances, shown in FIG. 2A as $R_{L1}$, $R_{L2}$, and $R_{L3}$. Moreover, integrated circuit 32 may include other aspects of ADC 12, but such are not show so as to simplify the discussion. Unlike the prior-art, however, the reference voltage for the ADC is not derived from $I_1$ and $I_2$ and a combination of $R_{REF}$, but rather it can be generated on chip or provided externally. Further, in a preferred embodiment, one reference resistor $R_r$ is added into the system (similar to $R_{REF}$ in the prior art, but used not to generate the ADC reference voltage). In addition, however, additional current switching functionality is included, so as to facilitate the preferred embodiment methodology, as further addressed below.

Circuit 32 includes an input multiplexer (MUX) 34, having two inputs $34_{I1}$ and $34_{I2}$ and two outputs $34_{O1}$ and $34_{O2}$. As shown schematically in FIG. 2A, input MUX 34 may pass each of inputs $34_{I1}$ and $34_{I2}$, respectively, to each of outputs $34_{O1}$ and $34_{O2}$. Alternatively, the inputs may be swapped relative to the outputs, in which case input $34_{I1}$ is connected to output $34_{O2}$ and input $34_{I2}$ is connected to output $34_{O1}$. In any event, for sake of reference, the voltage provided at output $34_{O1}$ is identified as $V_1$, and the voltage provided at output $34_{O2}$ is identified as $V_2$.

The outputs $34_{O1}$ and $34_{O2}$ connect their respective voltages $V_1$ and $V_2$ as a differential input to a programmable array amplifier (PGA) 36, which may be constructed according to principles known to, or ascertainable by, one skilled in the art. PGA 36 applies a gain, A, to the differential signal at its inputs, and thereby produces an output voltage, $V_a$, as shown in the following Equation 6:

$$V_a = A(V_1 - V_2) \quad \text{Equation 6}$$

Moreover, an offset voltage, $V_{OS}$, is associated with PGA 36, as may arise for example from manufacturing processes, device mismatch, and the like. To represent this aspect, FIG. 2A further illustrates that offset voltage, $V_{OS}$, added to the PGA 36 output of $V_a$, with the sum then input to an analog-to-digital conversion (ADC) block 38. ADC block 38 also may be constructed according to principles known to, or ascertainable by, one skilled in the art, so as to receive a reference voltage, $V_{REF}$, and then output a digital value, $V_d$, that represents its input divided by the reference voltage, $V_{REF}$, as shown in FIG. 2A and as also shown in the following Equation 7:

$$V_d = \frac{(V_a + V_{OS})}{V_{REF}} \quad \text{Equation 7}$$

Integrated circuit 32 also includes two current sources IDAC1 and IDAC2, each of which provides a respective current $I_1$ and $I_2$, to a respective input $40_{I1}$ and $40_{I2}$ of an IDAC multiplexer (MUX) 40. As shown schematically in FIG. 2A, IDAC MUX 40 may pass each of inputs $40_{I1}$ and $40_{I2}$, respectively, to each of outputs $40_{O1}$ and $40_{O2}$. Alternatively, the inputs may be swapped relative to the outputs, in which case input $40_{I1}$ is connected to output $40_{O2}$ and input $40_{I2}$ is connected to output $40_{O1}$. In addition and importantly to effect a preferred embodiment methodology described later, note also that IDAC MUX 40 includes a third switching apparatus, whereby either of its inputs $40_{I1}$ and $40_{I2}$ may be selected at a time and connected to an additional output $40_{O3}$.

As introduced above, circuit 32 is connected to a 3-lead RTD sensor 22, the details of which are now described. A first node $22_{N1}$, having a resistance $R_{L1}$ between it and a first terminal T1 of the temperature dependent resistance $R_{RTD}$, is connected to output $40_{O1}$ of IDAC MUX 40. A second node $22_{N2}$, having a resistance $R_{LEAD2}$ between it and a second terminal T2 of the temperature dependent resistance $R_{RTD}$, is connected to output $40_{O2}$ of IDAC MUX 40. A third node $22_{N3}$, having a resistance $R_{LEAD3}$ between it and the second terminal T2 of the temperature dependent resistance $R_{RTD}$, is connected to ground. Lastly and also importantly with respect to a preferred embodiment methodology described later, node $22_{N1}$ is also connected to a first terminal of a known temperature-insensitive reference resistor $R_r$, and the second terminal of reference resistor $R_r$ is connected to output node $40_{O3}$ of IDAC MUX 40. In a preferred embodiment, temperature-insensitive reference resistor $R_r$ may be a precision resistor or, for a system that is temperature variant, some type of resistance that is relatively stable and unresponsive to changes in temperature.

A detailed discussion of the operation of circuit 30 is provided below, and in an effort to introduce some of that discussion, some introductory aspects are first provided. In general, the overall function of circuit 30, which again illustrates an example of a preferred embodiment, is to accurately determine the voltage across resistor $R_{RTD}$. Of course, in this example, that determination then gives rise to a digital counterpart of the measure (i.e., $V_d$), which then also correlates to the temperature to which resistor $R_{RTD}$ is exposed. In the preferred embodiment, note the accuracy of this methodology is improved by the inclusion of resistor $R_r$, as well as the functionality provided by switches in IDAC MUX 40, so as to be able to selectively direct current $I_1$ (and in some instances, $I_2$ as well), to output $40_{O3}$, so that such current is directed through that resistor $R_r$. Accordingly, these aspects facilitate a preferred embodiment multiple step method, whereby in different steps different respective measures of $V_d$ are taken, corresponding to different current paths through circuit 30. Moreover, a preferred embodiment relationship between such measures is defined, resulting in a calibration factor that facilitates an improved final determination of the temperature to which resistor $R_{RTD}$ is exposed, by substantially reducing or eliminating the effects of factors that otherwise might diminish the accuracy of that determination. These aspects are functionally and mathematically discussed below.

Figure 2B:
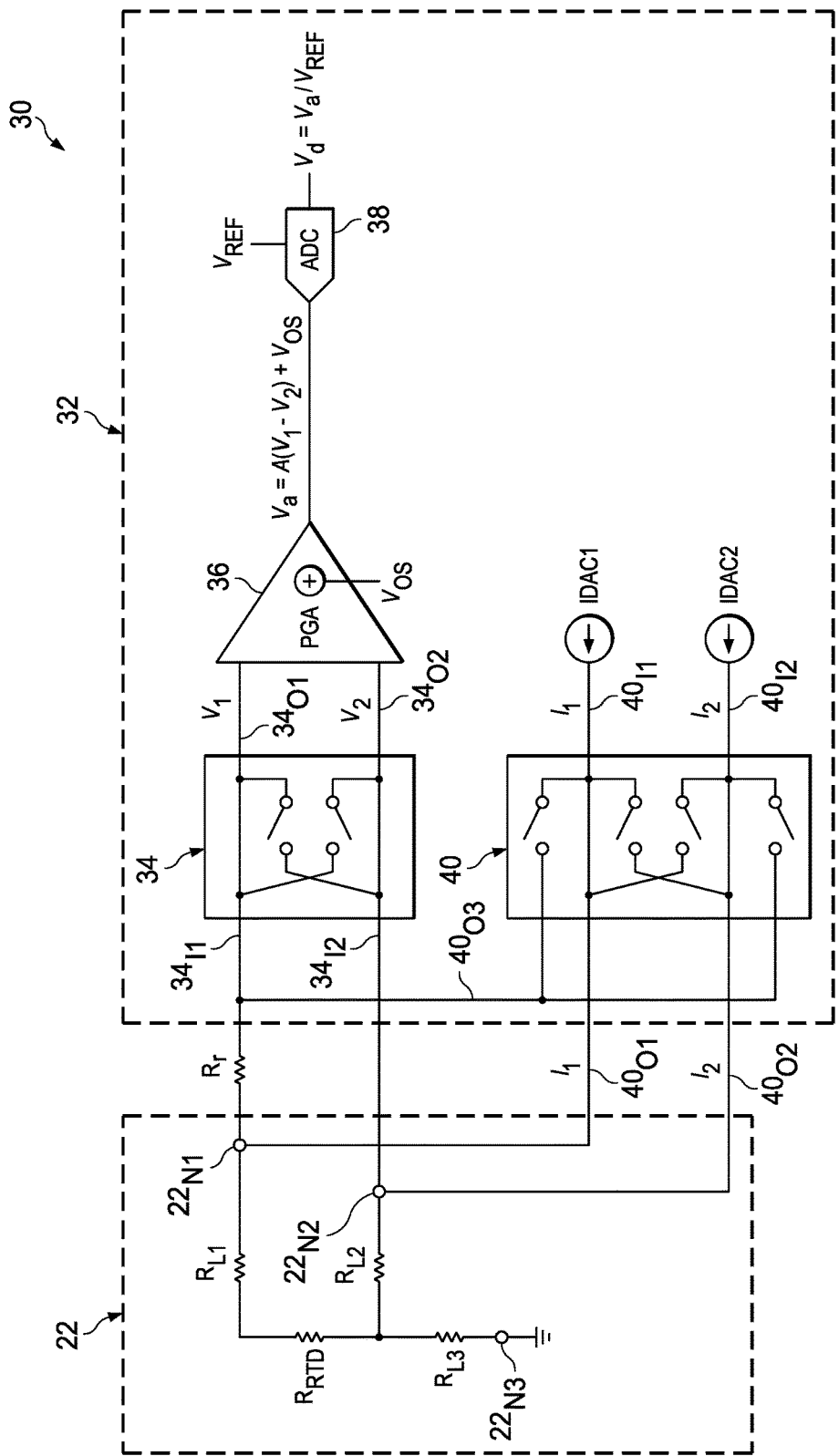
FIG. 2B illustrates RTD system 30 of FIG. 2A in a first switching configuration.

FIG. 2B illustrates RTD system 30 of FIG. 2A in a first switching configuration of the MUX switches in order to, at a time $t_1$, perform a first measure of $V_d$, which for timing reference that first measure is hereafter referred to as $V_{d1}$. In the FIG. 2B configuration, input MUX 34 is switched to connect input $34_{I1}$ to output $34_{O1}$ and input $34_{I2}$ to output $34_{O2}$, and IDAC MUX 40 is switched to connect input $40_{I1}$ to output $40_{O1}$ and input $40_{I2}$ to output $40_{O2}$. Note with respect to the current path of $I_1$, and given the high input impedance of PGA 36, that current $I_1$ does not pass through reference resistor $R_r$ in the configuration of FIG. 2B. Accordingly, in the illustrated FIG. 2B configuration, one skilled in the art can confirm that $V_1$ and $V_2$ are as shown in the following Equations 8 and 9:

$$V_1 = I_1(R_{L1} + R_{RTD} + R_{L3}) + I_2 R_{L3} \quad \text{Equation 8}$$

$$V_2 = I_1 R_{L3} + I_2(R_{L2} + R_{L3}) \quad \text{Equation 9}$$

Substituting Equations 8 and 9 into Equation 6 gives a same time $t_1$ value of $V_a$, shown as $V_{a1}$, in the following Equation 6.1:

$$V_{a1} = A(V_1 - V_2) \rightarrow A[I_1 R_{L1} + I_1 R_{RTD} + I_1 R_{L3} + I_2 R_{L3} - I_1 R_{L3} - I_2 R_{L2} - I_2 R_{L3}] = A[I_1 R_{RTD} + (I_1 - I_2) R_L] \quad \text{Equation 6.1}$$

where, in Equation 6.1, it is assumed that the lead resistances $R_{Lx}$ are equal, so $R_{L1} = R_{L2}$ and are thus expressed as $R_L$. Substituting Equation 6.1 into Equation 7 gives $V_{d1}$, in the following Equation 7.1:

$$V_{d1} = \frac{A}{V_{REF}}[I_1 R_{RTD} + (I_1 - I_2) R_L] + \theta \quad \text{Equation 7.1}$$

In Equation 7.1, $\theta$ is an offset error, defined as $$\theta = \frac{V_{OS}}{V_{REF}}.$$

In this regard, the preferred embodiment system 30 includes sufficient structure and methodology to perform offset cancellation so as to reduce this error to a negligible or zero amount. For example, one approach is an input short method, whereby the inputs to PGA 36 are shorted together (i.e., providing no outside input to PGA 36) and $V_d$ is measured, with that measured value stored and later used (e.g., in a calibration cycle) to subtract it so as to remove the offset. As another example, an alternative approach is an input swapping method, whereby in system 30 input MUX 34 is first switched as shown in FIG. 2B so as to connect input $34_{I1}$ to output $34_{O1}$ and input $34_{I2}$ to output $34_{O2}$ and a first measure $V_{as1}$ is taken, and thereafter the inputs are swapped so as to connect input $34_{I1}$ to output $34_{O2}$ and input $34_{I2}$ to output $34_{O1}$ and a second measure $V_{as2}$ is taken, and then the average of $V_{as1}$ and $V_{as2}$ becomes a value $V_{in}$, so as to remove the offset. This may be mathematically confirmed in the following Equations 10 through 12:

$$V_{as1} = A(V_1 - V_2) + V_{os} \quad \text{Equation 10}$$

$$V_{as2} = A(V_2 - V_1) + V_{os} \quad \text{Equation 11}$$

$$V_{in} = (V_{as1} - V_{as2})/2 \quad \text{Equation 12}$$

Note the resulting average in Equation 12 demonstrates that $V_{OS}$ has been removed from the impact on $V_{in}$, thereby confirming that the offset is cancelled from the measurement determination. In all events, therefore, the above approaches, or another ascertainable by one skilled in the art, thereby remove θ from Equation 7.1, giving $V_{d1}$, in the following Equation 7.1.1:

$$V_{d1} = \frac{A}{V_{REF}}[I_1 R_{RTD} + (I_1 - I_2)R_L] \quad \text{Equation 7.1.1}$$

Figure 2C:
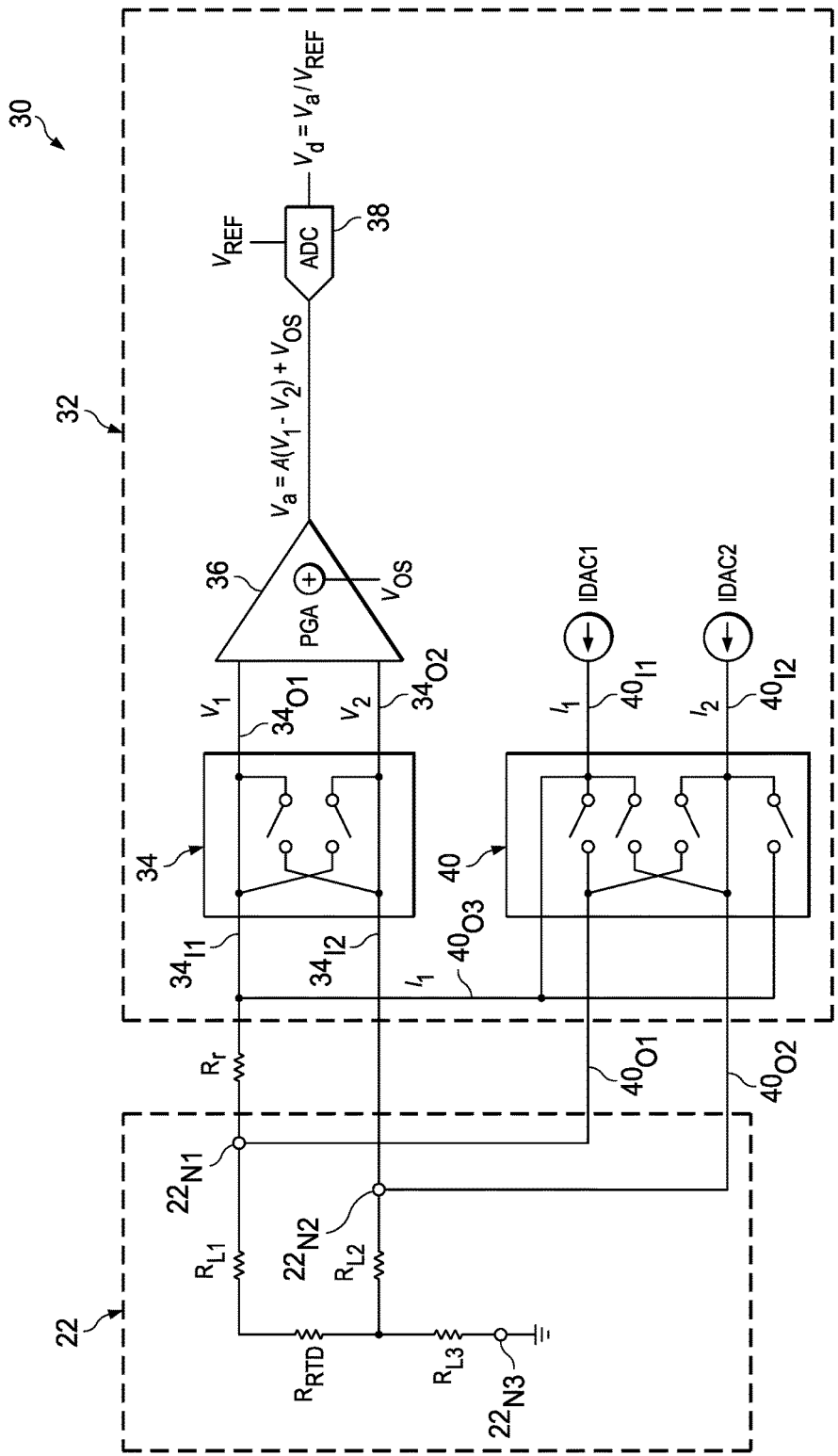
FIG. 2C illustrates RTD system 30 of FIG. 2A in a second switching configuration.

FIG. 2C illustrates RTD system 30 of FIG. 2A in a second switching configuration of the MUX switches in order to, at a time $t_2$, perform a second measure of $V_d$, which for timing reference that second measure is hereafter referred to as $V_{d2}$. In the FIG. 2C configuration, input MUX 34 is switched in the same configuration as in FIG. 2B (i.e., input $34_{I1}$ to output $34_{O1}$; input $34_{I2}$ to output $34_{O2}$), and IDAC MUX 40 is again switched to connect input $40_{I2}$ to output $40_{O2}$. Note, however, that IDAC MUX 40 is connected, alternatively with respect to FIG. 2B, to switch input $40_{I1}$ to output $40_{O3}$. In this configuration, therefore, the latter connection directs current $I_1$ also through resistor $R_r$. Accordingly, in the illustrated FIG. 2C configuration, one skilled in the art can confirm that $V_2$ is the same as shown in the earlier Equation 9, while $V_1$ is as shown in the following Equation 13:

$$V_1 = I_1(R_{L1} + R_{RTD} + R_{L3} + R_r) + I_2 R_{L3} \quad \text{Equation 13}$$

Substituting Equations 9 and 13 into Equation 6 gives a same time $t_2$ value of $V_a$ shown as $V_{a2}$, in the following Equation 6.2:

$$V_{a2} = A(V_1 - V_2) = A[I_1 R_L + I_1 R_{RTD} + I_1 R_{L3} + I_1 R_r + I_2 R_{L3} - I_1 R_{L3} - I_2 R_L - I_2 R_{L3}] = A[(I_1 - I_2)R_L + I_1 R_{RTD} + I_1 R_r] \quad \text{Equation 6.2}$$

where, in Equation 6.2, it is again assumed that the lead resistances R are equal, so $R_{L1} = R_{L2}$ and are thus expressed as $R_L$. Substituting Equation 6.2 into Equation 7 and assuming all lead resistances are equal gives $V_{d2}$, in the following Equation 7.2:

$$V_{d2} = \frac{A}{V_{REF}}[I_1 R_{RTD} + (I_1 - I_2)R_L + I_1 R_r] + \theta \quad \text{Equation 7.2}$$

Again in Equation 7.2, as was the case with Equation 7.1, θ is the offset error defined as $$\theta = \frac{V_{OS}}{V_{Ref}},$$

and recall the preferred embodiment implements structure and methodology to reduce or remove such error, in which case Equation 7.2 may be rewritten as in the following Equation 7.2.1:

$$V_{d2} = \frac{A}{V_{REF}}[I_1 R_{RTD} + (I_1 - I_2)R_L + I_1 R_r] \quad \text{Equation 7.2.1}$$

Given the preceding, the value of $R_{RTD}$ can be determined as a relationship of $V_{d2}$ and $V_{d1}$, so as to include the accuracy of the voltage measure $V_{d2}$ that included the precision resistor $R_r$ to calibrate the measure $V_{d1}$ taken with unknown resistor $R_{RTD}$ but without the precision resistor. In one preferred embodiment, this determination is made with the assumption that IDAC1 and IDAC2 are sufficiently matched and controlled so that $I_1 = I_2$. In this regard, then $V_{d1}$ of Equation 7.1.1 is as shown in the following Equation 7.1.2, and $V_{d2}$ of Equation 7.2.1 is as shown in the following Equation 7.2.2:

$$V_{d1} = \frac{A}{V_{REF}}[I_1 R_{RTD}] \quad \text{Equation 7.1.2}$$

$$V_{d2} = \frac{A}{V_{Ref}}[I_1 R_{RTD} + I_1 R_r] \quad \text{Equation 7.2.2}$$

Given the measures of $V_{d1}$ and $V_{d2}$ and Equations 7.1.2 and 7.2.2, the preferred embodiment solution for resistor $R_{RTD}$ is next understood via the difference of those voltages, as shown in the following Equation 14:

$$V_{d2} - V_{d1} = \frac{A}{V_{REF}} I_1 R_r \quad \text{Equation 14}$$

Equation 14 can be rearranged as shown in the following Equation 15 definition of a quantity, designated herein as β:

$$\frac{A}{V_{REF}} I_1 = \frac{V_{d2} - V_{d1}}{R_r} = \beta \quad \text{Equation 15}$$

Equation 15, therefore, demonstrates that β can be expressed in either of two forms, namely, as a first form, $$\frac{A}{V_{REF}} I_1$$

or as a second form, $$\frac{V_{d2} - V_{d1}}{R_r}.$$

These forms allow a solution that determines the measure of $R_{RTD}$, as follows. First, recall under the assumption of that $I_1 = I_2$ that $V_{d1}$ is as shown in Equation 7.1.2, and the following Equation 16 demonstrates the result of dividing that value of $V_{d1}$ by the first form of β from Equation 15:

$$\frac{V_{d1}}{\beta} = \frac{A * I_1 * R_{RTD}}{V_{REF}} * \frac{V_{REF}}{A * I_1} = R_{RTD} \quad \text{Equation 16}$$

So, Equation 16 demonstrates that the ratio of $V_{d1}$ to β yields $R_{RTD}$, that is, a solution for determining $R_{RTD}$ is provided once β is determined—in this sense, therefore, and in the context of a preferred embodiment, β represents a calibration factor for adjusting $V_{d1}$ so as to determine $R_{RTD}$. Note that such a calibration factor, as well as others described herein, are therefore calculable per the preferred embodiment, including by software executed by some type of circuitry, so for this document any reference to circuitry for determining or applying such a calibration factor is intended to further include such circuitry as programmed by, or responding to, software consistent with Equation 16 or others directed to calibration factors herein. In any event, therefore, $R_{RTD}$ may be expressed in two manners, as shown in the following Equation 17:

$$\frac{V_{d1}}{\beta} = R_{RTD} = V_{d1} \div \frac{V_{d2} - V_{d1}}{R_r} = \frac{V_{d1} * R_r}{V_{d2} - V_{d1}} \qquad \text{Equation 17}$$

In view of the preceding, therefore, in one preferred embodiment, and with the assumption that $I_1 = I_2$, then from Equation 15, the value of calibration factor β

$$\left(\text{i.e., } \frac{V_{d2} - V_{d1}}{R_r}\right)$$

may be determined given the measure $V_{d1}$ at time $t_1$, the measure $V_{d2}$ at time $t_2$, and the known value of the precision resistor $R_r$. With this value of β, any measure of $V_{d1}$ may be subsequently taken and divided (i.e., calibrated) by the value of β, thereby providing a more precise measure of $R_{RTD}$. In this respect, therefore, the preferred embodiment is able to accurately measure an unknown resistance (or voltage across that resistance) by two steps:

(1) in a first step, directing a known current between two nodes and measuring the voltage (i.e., $V_{d1}$) between those two nodes, where the voltage to be determined is across an element (e.g., resistor $R_{RTD}$) between those two nodes, and (2) in a second step, adding a known consistent resistance (e.g., resistor $R_r$) in series with the element and between those two nodes, and again directing a known current between the two nodes and measuring the voltage (i.e., $V_{d2}$) between those two nodes. Given that the added consistent resistance is known, the resulting voltage contributed between the two nodes in the second step (i.e., across the added consistent resistance) provides a manner of determining a calibration factor, such as a ratio or an expected relationship, as to the voltage across the consistent resistance and that across the unknown resistance. Thereafter, the calibration factor may be used for later voltage measures between the two nodes, without the added resistance, so as to more accurately determine the measured voltage between those nodes. Thus, an accurate determination is determined for $R_{RTD}$, thereby allowing a corresponding determination of temperature. Moreover, note that by cancelling out common factors from earlier equations to arrive at Equation 17, then it is independent of the error in gain A of PGA 36, of any error in the reference voltage $V_{REF}$ (so long as gain A and $V_{REF}$ remain the same for the measures of $V_{d1}$ and $V_{d2}$) and any drift in IDAC current, so long as the latter does not alter the assumption that $I_1 = I_2$. Lastly, note also that in one preferred embodiment, the value of β may be determined each time a determination of $R_{RTD}$ is desired. In an alternative preferred embodiment and to reduce overhead, however, the value of calibration factor β may be determined once and stored and re-used with a plurality of different times that the value of $V_{d1}$ is measured, so as to determine $R_{RTD}$ for each of those different times and with a new value of β only periodically determined if a change in gain A and $V_{REF}$ occurred for some reason, for example, after a particular temperature change has occurred—this latter change may be detected, for example, by including within system 30 an additional coarse temperature measurement device, thereby providing an additional representation of temperature, apart from resistor $R_{RTD}$.

Figure 2D:
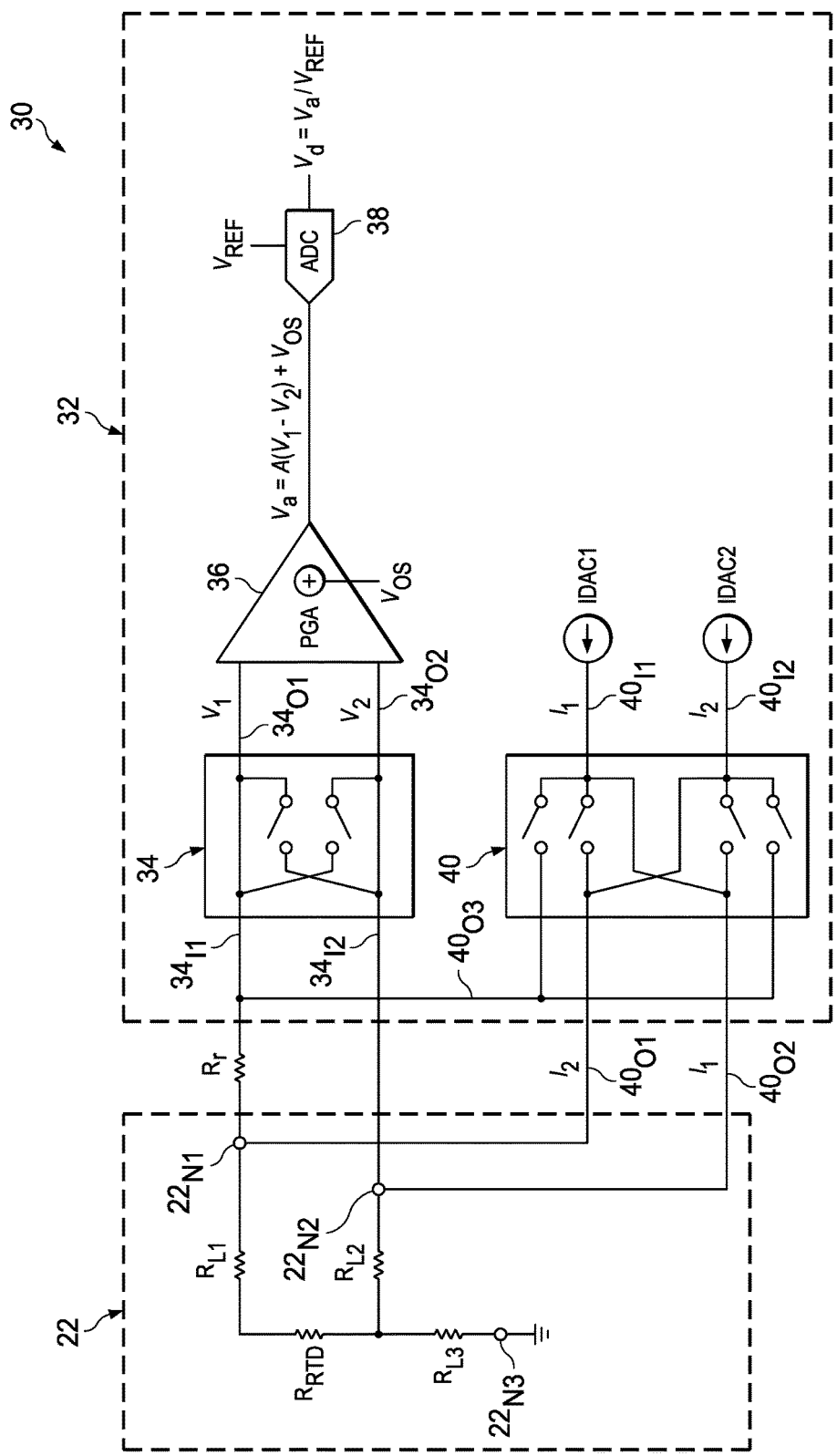
FIG. 2D illustrates RTD system 30 of FIG. 2A in a third switching configuration.
Figure 2E:
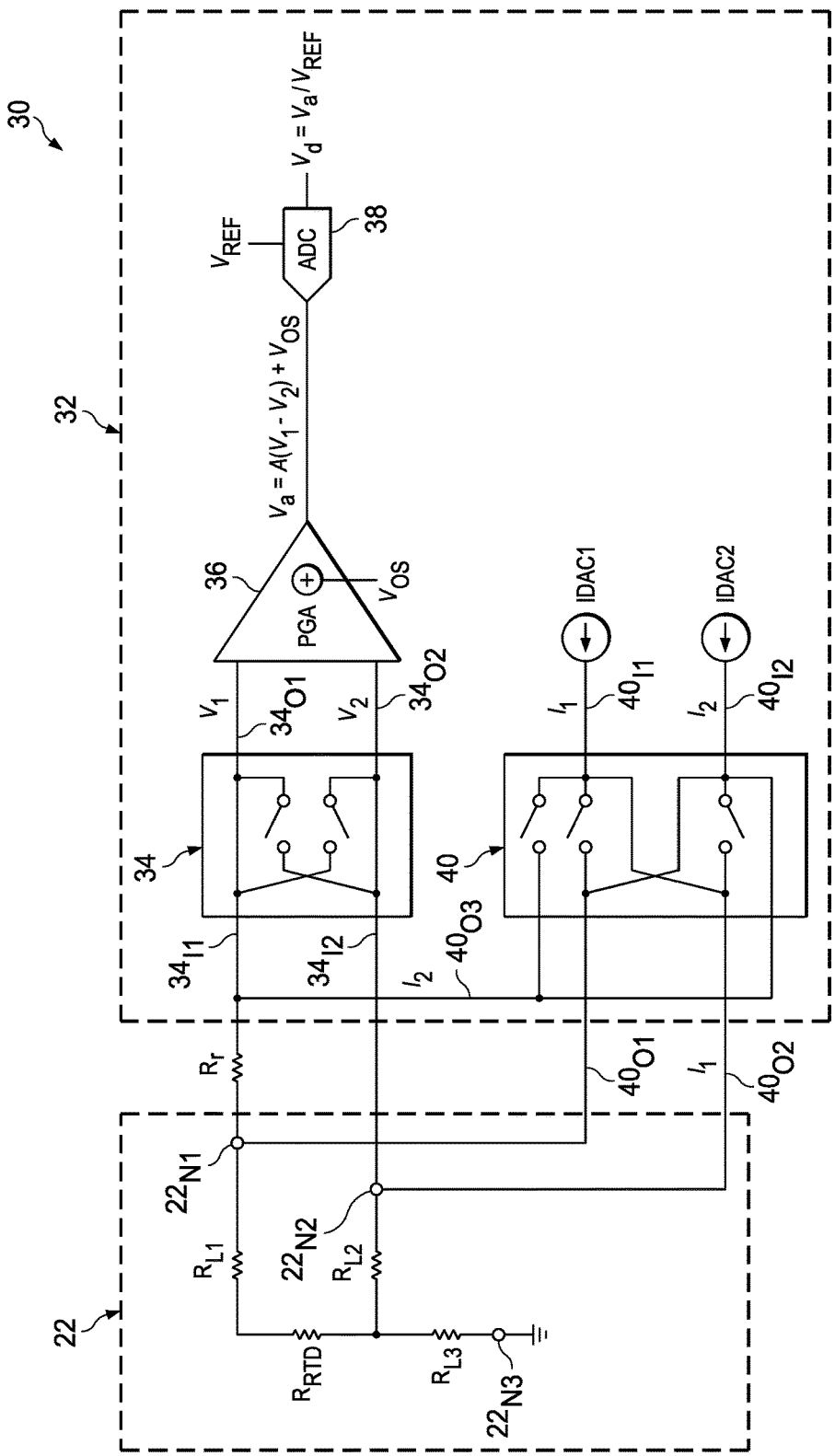
FIG. 2E illustrates RTD system 30 of FIG. 2A in a fourth switching configuration.

While the preferred embodiment of FIGS. 2B and 2C determine $R_{RTD}$ with the assumption that $I_1 = I_2$, an additional preferred embodiment performs two additional method steps so as to remove that assumption, to thereby further improve the performance measure of $R_{RTD}$, as is now explored with respect to FIGS. 2D and 2E. By way of introduction, note that FIGS. 2D and 2E repeat in general the steps of FIGS. 2B and 2C, respectively, however, IDAC MUX 40 is switched so as to swap the current paths of $I_1$ and $I_2$, wherein in a first step $I_2$ is directed so as to bypass resistor $R_r$, and in a second step $I_2$ is directed so to flow through a series path that includes resistor $R_r$, with a respective voltage measure in each such step, as further discussed below.

FIG. 2D illustrates RTD system 30 of FIG. 2A in a third switching configuration of the MUX switches in order to, at a time $t_3$, perform a third measure of $V_d$, which for timing reference that first measure is hereafter referred to as $V_{d3}$. In the FIG. 2D configuration, input MUX 34 is switched in the same manner as was the case in FIG. 2B, that is, to connect input $34_{I1}$ to output $34_{O1}$ and input $34_{I2}$ to output $34_{O2}$; IDAC MUX 40, however, is switched to swap its connections relative to FIG. 2B, so that in FIG. 2D MUX 40 connects input $40_{I1}$ to output $40_{O2}$ and input $40_{I2}$ to output $40_{O1}$. Note with respect to the current path of $I_2$, and given the high input impedance of PGA 36, that current $I_2$ does not pass through reference resistor $R_r$ in the configuration of FIG. 2D. Accordingly, in the illustrated FIG. 2D configuration, one skilled in the art can confirm that $V_1$ and $V_2$ are as shown in the following Equations 18 and 19:

$$V_1 = I_2(R_{L1} + R_{RTD} + R_{L3}) + I_1 R_{L3} \qquad \text{Equation 18}$$

$$V_2 = I_2 R_{L3} + I_1(R_{L2} + R_{L3}) \qquad \text{Equation 19}$$

Substituting Equations 18 and 19 into Equation 6 gives a same time $t_3$ value of $V_a$, shown as $V_{a3}$, in the following Equation 6.3:

$$V_{a3} = A(V_1 - V_2) = A[I_2 R_{L1} + I_2 R_{RTD} + I_2 R_{L3} + I_1 R_{L3} - I_2 R_{L3} - I_1 R_{L2} - I_1 R_{L3}] = A[(I_2 - I_1)R_L + I_2 R_{RTD}] \qquad \text{Equation 6.3}$$

where, in Equation 6.3, it is assumed that the lead resistances $R_{Lx}$ are equal, so $R_{L1} = R_{L2}$ and are thus expressed as $R_L$. Substituting Equation 6.3 into Equation 7 gives $V_{d3}$, in the following Equation 7.3:

$$V_{d3} = \frac{A}{V_{REF}}[I_2 R_{RTD} + (I_2 - I_1)R_L] + \theta \qquad \text{Equation 7.3}$$

In Equation 7.3, θ is the same offset error, defined earlier as $$\theta = \frac{V_{OS}}{V_{REF}}.$$

Recall in a preferred embodiment system 30 includes sufficient structure and methodology that perform offset cancellation so as to reduce this error to a negligible or zero amount, thereby removing θ from Equation 7.3, giving $V_{d3}$, in the following Equation 7.3.1:

$$V_{d3} = \frac{A}{V_{REF}}[I_2 R_{RTD} + (I_2 - I_1)R_L]  \quad \text{Equation 7.3.1}$$

FIG. 2E illustrates RTD system 30 of FIG. 2A in a fourth switching configuration of the MUX switches in order to, at a time $t_4$, perform a fourth measure of $V_d$, which for timing reference that first measure is hereafter referred to as $V_{d4}$. In the FIG. 2E configuration, input MUX 34 is switched in the same configuration as in FIG. 2D (i.e., input $34_{I1}$ to output $34_{O1}$; input $34_{I2}$ to output $34_{O2}$), and IDAC MUX 40 is again switched to connect input $40_{I1}$ to output $40_{O2}$. Note, however, that IDAC MUX 40 is, alternatively with respect to FIG. 2D, connected to switch input $40_{I2}$ to output $40_{O3}$. In this configuration, therefore, the latter connection directs current $I_2$ also through resistor $R_r$. Accordingly, in the illustrated FIG. 2E configuration, one skilled in the art can confirm that $V_2$ is the same as shown in the earlier Equation 19, while $V_1$ is as shown in the following Equation 20:

$$V_1 = I_2(R_{L1} + R_{RTD} + R_{L3} + R_r) + I_1 R_{L3} \quad \text{Equation 20}$$

Substituting Equations 19 and 20 into Equation 6 gives a same time $t_4$ value of $V_a$, shown as $V_{a4}$, in the following Equation 6.4:

$$V_{a4} = A(V_1 - V_2) = A[I_2 R_{L1} + I_2 R_{RTD} + I_2 R_{L3} + I_2 R_r + I_1 R_{L3} - I_2 R_{L3} - I_1 R_{L2} - I_1 R_{L3}] = A[(I_2 - I_1)R_L + I_2 R_{RTD} + I_2 R_r] \quad \text{Equation 6.4}$$

where, in Equation 6.4, it is assumed that the lead resistances $R_{Lx}$ are equal, so $R_{L1} = R_{L2}$ and are thus expressed as $R_L$. Substituting Equation 6.4 into Equation 7 gives $V_{d4}$, in the following Equation 7.4:

$$V_{d4} = \frac{A}{V_{REF}}[I_2 R_{RTD} + (I_2 - I_1)R_L + I_2 R_r] + \theta \quad \text{Equation 7.4}$$

Again in Equation 7.4, as was the case with Equation 7.1, 9 is the offset error defined as $$\theta = \frac{V_{OS}}{V_{Ref}};$$

recall, the preferred embodiment implements structure and methodology to reduce or remove such error, but note that such error also may be removed by subtracting $V_{d3}$ from $V_{d4}$, as shown in the following Equation 21:

$$V_{d4} - V_{d3} = \frac{A}{V_{REF}}I_2 R_r \quad \text{Equation 21}$$

Equation 21 can be rearranged as shown in the following Equation 22 definition of another calibration factor, designated herein as α:

$$\frac{A}{V_{REF}}I_2 = \frac{V_{d4} - V_{d3}}{R_r} = \alpha \quad \text{Equation 22}$$

Equation 22, therefore, demonstrates that a second calibration factor α can be expressed in either of two forms, namely, as a first form, $$\frac{A}{V_{REF}}I_2$$

or as a second form, $$\frac{V_{d4} - V_{d3}}{R_r}.$$

The second form, therefore, is measurable in the preferred embodiment system 30 in a manner comparable to how β was determined with a first current (i.e., $I_1$), again by two steps, but here by a second current (i.e., $I_2$):

(1) in a first step, directing a second known current between two nodes and measuring the voltage (i.e., $V_{d3}$) between those two nodes, where the voltage to be determined is across an element (e.g., resistor $R_{RTD}$) between those two nodes, and (2) in a second step, adding a known consistent resistance (e.g., resistor $R_r$) in series with the element and between those two nodes, and again directing the second known current between the two nodes and measuring the voltage (i.e., $V_{d4}$) between those two nodes. Thereafter, the second calibration factor follows the relationship of the second form of Equation 22.

Note also that the forms of Equation 22 allow Equation 7.3 to be-written per the following Equation 23:

$$V_{d3} = \alpha R_{TD} + (\alpha - \beta)R_L + \theta \quad \text{Equation 23}$$

where, in Equation 23:

the first term is seen as the first form of α from Equation 22 as shown in the first addend of Equation 7.3, and (α−β) is as confirmed in the following Equation 24, which subtracts the first form of Equation 15 from the first form of Equation 22:

$$\alpha - \beta = \frac{A}{V_{REF}}I_2 - \frac{A}{V_{REF}}I_1 = \frac{A}{V_{REF}}(I_2 - I_1) \quad \text{Equation 24}$$

In a similar manner, the above forms also allow $V_{d1}$ of Equation 7.1, which recall is before any assumption of $I_1 = I_2$, to be re-written as the following Equation 25:

$$V_{d1} = \beta R_{RTD} + (\beta - \alpha)R_L + \theta \quad \text{Equation 25}$$

where, in Equation 25:

the first term is seen as the first form of β from Equation 15 as shown in the first addend of Equation 7.1, and (β−α) is the negative of Equation 24, which when multiplied times $R_L$ represents the second addend of Equation 7.1.

Next, Equations 23 and 25 can be added, as shown in the following Equation 26:

$$V_{d1} + V_{d3} = \alpha R_{RTD} + \alpha R_L - \beta R_L + \theta + \beta R_{RTD} + \beta R_L - \alpha R_L + \theta = \alpha R_{RTD} + \beta R_{RTD} + 2\theta = (\alpha + \beta)R_{RTD} + 2\theta \quad \text{Equation 26}$$

Recall that the preferred embodiment includes structure and method to render θ negligible and therefore equal to zero in Equation 26, in which case that Equation can be re-written in terms of $R_{RTD}$ as shown in the following Equation 27:

$$R_{RTD} = \frac{V_{d3} + V_{d1}}{\beta + \alpha} = R_r \frac{V_{d3} + V_{d1}}{V_{d4} - V_{d3} + V_{d2} - V_{d1}} \qquad \text{Equation 27}$$

Given the preceding, the value of $R_{RTD}$ can be confirmed as a relationship of $V_{d1}$, $V_{d2}$, $V_{d3}$, and $V_{d4}$, without requiring the assumption that IDAC1 and IDAC2 are sufficiently matched and controlled (i.e., not requiring $I_1=I_2$). Such confirmation may be implemented by a periodic determination of $\alpha$ and $\beta$ with a known resistance $R_r$ in series with resistance $R_{RTD}$, and as shown in Equation 27 may thereafter be used to adjust measured voltages (i.e., $V_{d3}$ and $V_{d1}$, or as shown, $V_{d3}+V_{d1}$) that are taken without that series resistance. Thus, Equation 27 confirms an accurate measure/determination of $R_{RTD}$ is provided that is independent of drift (or even absolute value) error in IDAC, reference, offset and PGA gain. In addition, note that the values of $\alpha$ and $\beta$ need not be measured for every different sensor or temperature determination; instead, they may be measured once and used for multiple different inputs (sensor) or multiple measurements until the temperature drifts significantly, again, where the latter may be evaluated via a secondary and less accurate (e.g., coarse) temperature measuring device. Thus, if a user is performing an even number of measurements or averaging, the preferred embodiment can effectively calibrate the system without any extra time or measurement overhead.

The preceding demonstrates inventive scope though one example of an elegant implementation of the calibration in connection with an RTD system 30, so as to provide for such calibration using the same input pins as otherwise used for the measurement of temperature-dependent resistance $R_{RTD}$. Various inventive teachings from that example also may be applied to other contexts and devices, where different current sources alternatively provide current to a circuit element and a voltage measurement is desired across that element. Thus, where the above example provides the circuit element as a resistor (i.e., resistance $R_{RTD}$), an alternative preferred embodiment measures voltage across a different circuit element (e.g., a capacitor) and, preferably, uses a reference element of the same nature as the circuit element (e.g., both the measured circuit element and reference element as capacitors). Further, where the above example connects the different current sources (i.e., IDAC1, IDAC2) alternatively to a series connection of the circuit element at issue and a reference resistor $R_r$ or other reference circuit element, an alternative preferred embodiment provides a separate (e.g., dedicated) input channel or pin connected to the reference resistor $R_r$ or other reference circuit element, wherein the different current sources alternatively provide current to the circuit element at issue and to the reference element (e.g., resistor $R_r$) via its respective input channel, whereby a first voltage measure across the reference element (e.g., resistor $R_r$) when the first current source is directed through it is taken, a second voltage measure across the reference element (e.g., resistor $R_r$) when the second current source is directed through it is taken, and a relationship between those measures as well as the respective measures against the circuit element at issue is established, so as to cancel out any common error in the measures (e.g., amplifier gain, input offset, current source mismatch) leaving a calibration factor that is then used to adjust the measured voltage across the measured circuit element. Indeed, such an approach could be implemented in connection with system 30 by connecting the reference resistor $R_r$ separately between two outputs (e.g., $40_{O1}$ and $40_{O2}$), while connecting the resistor $R_{RTD}$ between the differential inputs of amplifier 36. As a final example, any of the above preferred embodiment aspects are not limited to a resistance temperature detector, but could be used with other sensors, detectors, or circuits.

From the above, various embodiments provide numerous improvements to electronic circuits and more particularly circuits wherein a calibrated measure is performed. One exemplary circuit described is an RTD sensor, but the preferred embodiments may apply to various different electronic circuits, wherein a measure of voltage is a response to some factor being sensed or determined in connection with the circuit. Thus, preferred embodiment aspects may be implemented in a standalone device or may be incorporated into a larger processor circuit, such as a microcontroller or microprocessor. The preferred embodiment provides a self-calibration structure and methodology with a minimum analog and digital overhead. Moreover, the preferred embodiment may provide significant performance boost and may reduce significant test cost. A preferred embodiment circuit may self-calibrate and overcome process and circuit limitations where drift may otherwise diminish the precision of voltage measurements. Further, various aspects have been described, and still others will be ascertainable by one skilled in the art from the present teachings. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A circuit, comprising:
 a first node;
 a second node;
 a first circuit element coupled between the first node and the second node;
 a second circuit element to direct a first current across the first circuit element coupled between the first node and the second node in a first time instance;
 a third circuit element to switch a known resistance in series with the first circuit element coupled between the first node and the second node and to direct the first current across the known resistance and the first circuit element in a second time instance;
 a fourth circuit element to determine a first voltage based on a voltage difference between the first node and the second node in the first time instance and to determine a second voltage based on a voltage difference between the first node and the second node in the second time instance; and
 programmed circuitry to determine a calibration factor in response to a ratio equal to dividing a difference between the first voltage and the second voltage by the known resistance.

2. The circuit of claim 1, wherein the programmed circuitry is configured to determine a characteristic of the first circuit element in response to the first voltage and the calibration factor.

3. The circuit of claim 2, wherein the first circuit element comprises a resistor, and wherein the characteristic of the first circuit element is resistance.

4. The circuit of claim 2, wherein the calibration factor is determined for each determination of the characteristic of the first circuit element.

5. The circuit of claim 4, wherein, in the third time instance, the known resistance is switched out of series with the first circuit element coupled between the first node and the second node so that the first current is not directed across the known resistance.

6. The circuit of claim 2, wherein the calibration factor is determined for plural different instances of determination of the characteristic of the first circuit element.

7. The circuit of claim 6, further comprising:
a temperature sensor in response to which the calibration factor is determined for the plural different instances of determination of the characteristic of the first circuit element.

8. The circuit of claim 1, wherein the fourth circuit element is configured to determine a third voltage based on a voltage difference between the first node and the second node in a third time instance occurring after the first time instance and the second time instance, and wherein the programmed circuitry is configured to apply the calibration factor to the third voltage.

9. The circuit of claim 1, wherein each of the second and third circuit elements comprises a switch.

10. The circuit of claim 1, wherein the fourth circuit element comprises:
a differential input amplifier (DIA) having a first input coupled to the first node, a second input coupled to the second node, and an output to output a DIA output voltage; and
an analog to digital converter (ADC) having a first input to receive the PGA output voltage and a second input to receive a reference voltage and an output to output an ADC output voltage, wherein the ADC output voltage is the first voltage during the first time instance and is the second voltage during the second time instance.

11. The circuit of claim 10, wherein the differential input amplifier is a programmable gain amplifier.

12. The circuit of claim 1, wherein the first circuit element includes a temperature-dependent resistor, and wherein the programmed circuitry is configured determine a resistance of the temperature-dependent resistor based at least partially on the first voltage and the calibration factor.

13. A circuit comprising:
a first node;
a second node;
a first circuit element coupled between the first node and the second node;
a second circuit element to direct a first current across the first circuit element coupled between the first node and the second node in a first time instance;
a third circuit element to switch a known resistance in series with the first circuit element coupled between the first node and the second node and to direct the first current across the known resistance and the first circuit element in a second time instance;
a fourth circuit element to directing a second current across the first circuit element coupled between the first node and the second node in a third time instance;
a fifth circuit element to switch the known resistance in series with the first circuit element coupled between the first node and the second node and to direct the second current across the known resistance and the first circuit element in a fourth time instance;
a sixth circuit element to determine a first voltage based on a voltage difference between the first node and the second node in the first time instance, to determine a second voltage based on a voltage difference between the first node and the second node in the second time instance, to determine a third voltage based on a voltage difference between the first node and the second node in the third time instance, and to determine a fourth voltage based on a voltage difference between the first node and the second node in the fourth time instance; and
programmed circuitry to determine a first calibration factor in response to a relationship between the first voltage, the second voltage, and the known resistance and to determine a second calibration factor in response to a relationship between the third voltage, the fourth voltage, and the known resistance.

14. The circuit of claim 13, wherein the sixth circuit element is configured to determine a fifth voltage between the first node and the second node in a fifth time instance occurring after the first, second, third, and fourth time instances, and wherein the programmed circuitry is configured to apply the first calibration factor and the second calibration factor to the fifth voltage.

15. The circuit of claim 13, wherein the programmed circuitry is configured to determine the first calibration factor as a ratio of a first value to the known resistance and to determine the second calibration factor as a ratio of a second value to the known resistance, wherein the first value is equal to a difference between the first and second voltages and the second value is equal to a difference between the third and fourth voltages.

* * * * *